US005898409A

United States Patent [19]

Holzman

[11] Patent Number: 5,898,409

[45] Date of Patent: Apr. 27, 1999

[54] BROADBAND ANTENNA ELEMENT, AND ARRAY USING SUCH ELEMENTS

[75] Inventor: Eric Louis Holzman, Medford, N.J.

[73] Assignee: Lockheed Martin Corporation, Moorestown, N.J.

[21] Appl. No.: 08/921,069

[22] Filed: Aug. 29, 1997

[51] Int. Cl.$^6$ .................... H01Q 13/00; H01Q 3/02; H03H 5/00

[52] U.S. Cl. .................. 343/786; 343/786; 343/700 MS; 343/772; 343/773; 333/26; 333/25

[58] Field of Search .................. 343/786, 772, 343/773, 774, 776, 700 MS; 333/246, 238, 25, 26

[56] References Cited

U.S. PATENT DOCUMENTS 4,500,887 2/1985 Nester .................. 343/700 MS 5,325,105 6/1994 Cermignani et al. .................. 343/786

*Primary Examiner*—Don Wong

*Assistant Examiner*—James Clinger

*Attorney, Agent, or Firm*—W. H. Meise; S. D. Weinstein

[57] ABSTRACT

A broadband horn-like, linearly polarized antenna element is driven from a microstrip line and a balun. The horn is skeletonized, and has no sides, and consequently operates in TEM mode for broad frequency bandwidth. In another embodiment, two or more baluns feed the horn-like antenna element, thereby allowing a plurality of amplifiers or other sources to be combined at the antenna, for power summation or for multiplexing. An array of such elements, arranged for both vertical and horizontal polarization, makes a structure which presents mostly metallic surfaces, and is therefore rugged, and overpressure resistant.

11 Claims, 9 Drawing Sheets

BROADBAND ANTENNA ELEMENT, AND ARRAY USING SUCH ELEMENTS

FIELD OF THE INVENTION

This invention relates to antennas, and more particularly to antenna arrays made up of elements which are hardened against blast and radiation.

BACKGROUND OF THE INVENTION

Antenna arrays are widely used for communication and sensing in a variety of environments. Some of the environments, such as military shipboard use, are extremely harsh, in that the antenna arrays are subject to mechanical stress attributable to wind and high waves, and the corrosion attendant on a salt-water environment. Additionally, some antenna arrays may be expected to continue operation notwithstanding blast and radiation effects stemming from common or nuclear explosions.

Moreover, with communications and sensing becoming increasingly important, vehicles and communication sites carry many antennas, for covering various bands of frequencies, and for generating various different beam patterns. The proliferation of different antennas at a single site or installation tends to degrade the environment for the other antennas, making it more difficult to achieve the desired performance. For this reason, "broadband" antennas, which can cover broad bands of frequencies, are desired. However, it is difficult to achieve broad bandwidth from an antenna element, and especially so in the context of an antenna array.

Vivaldi and tapered notch antennas have been shown to have a bandwidth approaching 5:1 in an array context. However, these antennas are difficult to harden against the elements and blast overpressure.

Improved broadband, hardened antenna elements, suitable for use in a hardened antenna array, are desired.

SUMMARY OF THE INVENTION

In general, a broadband horn-like, linearly polarized antenna element is driven from a microstrip line and a balun. The horn may be viewed as being skeletonized, in that it has no conductive sides, and consequently operates in TEM mode for broad frequency bandwidth. In another embodiment, two or more baluns feed the horn-like antenna element, thereby allowing a plurality of amplifiers or other sources to be combined at the antenna, for power summation or for multiplexing. An array of such elements, arranged for both vertical and horizontal polarization, makes a structure with a face which is for the most part metallic surfaces, and can be made rugged and overpressure resistant.

More particularly, an antenna element according to an aspect of the invention includes a first feed structure including a transition between a balanced horn feed, lying in a transverse horn feed plane, and a transmission line located proximally relative to the horn feed plane. The first feed structure includes a rectangular dielectric substrate defining first and second mutually parallel broad surfaces, first and second mutually parallel narrow edges separated by a substrate width, and a distal end lying in, and orthogonal to, the horn feed plane.

The transmission line includes an electrically conductive ground plane, and a strip conductor. The conductive ground plane overlies the entirety of the first broad surface of the dielectric substrate at locations lying between the first and second narrow edges of the dielectric substrate, at locations more proximal than a second transverse plane orthogonal to the first and second broad surfaces. The second transverse plane is located proximally relative to the horn feed plane. The strip conductor defined by the transmission line also defines an elongated centerline extending parallel to the first and second narrow edges of the dielectric substrate, at least near the second transverse plane. The strip conductor overlies at least a portion of the second broad surface. The transition includes a further portion of the ground plane which overlies the entirety of the first broad surface of the dielectric substrate at locations near the second transverse plane, and overlies only a small portion of the first broad surface of the dielectric substrate adjacent the first narrow edge of the dielectric substrate at locations near the distal end of the dielectric substrate. The further portion of the ground plane defines a taper lying between the second transverse plane and a first horn feed point of the balanced horn feed near the juncture of the first narrow edge and the distal end of the dielectric substrate. The transition also includes a further portion of the strip conductor, on the second side of the dielectric substrate. The further portion of the strip conductor defines a centerline which extends, at an angle relative to the centerline of the strip conductor of the transmission line, toward the second narrow edge of the dielectric substrate. The further portion of the strip conductor tapers from a first width to a second width. The first width is equal to the width of the strip conductor in the transmission line at locations near a third transverse plane, which third transverse plane is no more proximal than the second transverse plane. The second width is greater than the first width at locations adjacent the second narrow edge of the dielectric substrate. The further portion of the strip conductor includes a portion which extends to a second horn feed point of the balanced horn feed near the juncture of the second narrow edge and the distal end of the dielectric substrate. As a result of this structure, the transition transitions between a balanced electric field state at the first and second horn feed points and an unbalanced electric field state in the transmission line, and physically rotates an electric field between its balanced and unbalanced states. The antenna element also includes electrically conductive first and second horn plates connected to the first and second horn feed points, respectively. The first and second horn plates are separated, at the horn feed plane, by a distance equal to the substrate width, and diverge with increasing distance in the distal direction from the horn feed plane, so as to be separated by a distance greater than the substrate width at locations remote from the horn feed plane.

In a particular embodiment of the invention, the taper of the ground plane portion in the transition is a linear taper. In another embodiment, the centerline of the strip conductor in the transmission line is centered between the first and second narrow edges of the dielectric substrate, at least near the third transverse plane. In yet another embodiment, the antenna element further comprises electrically conductive top and bottom plates. The top plate is in contact with the first horn plate at the horn feed plane, and extends proximally, parallel to the centerline of the strip conductor, in galvanic contact with the ground plane of the transmission line. The bottom plate is in contact with the second horn plate at the horn feed plane, and extends proximally, parallel to the centerline of the strip conductor, in galvanic contact with the ground plane of the transmission line.

In a more particular embodiment, the first and second horn plates have a predetermined width in a direction transverse to the centerline of the strip conductor, and the first and second horn feed points of the first feed are affixed to the first and second horn plates in a first longitudinal plane substantially coincident with the dielectric substrate. This embodiment further comprises a second feed including a second transition between a second balanced horn feed lying in the transverse horn feed plane, and a second transmission line located proximally relative to the horn feed plane. The second feed includes a rectangular second dielectric substrate defining first and second mutually parallel broad surfaces, first and second mutually parallel narrow edges separated by a substrate width, and a distal end lying in, and orthogonal to, the horn feed plane. The second transmission line includes (a) an electrically conductive ground plane overlying the entirety of the first broad surface of the second dielectric substrate lying between the first and second narrow edges of the second dielectric substrate at locations more proximal than the second transverse plane. The second transmission line also includes a strip conductor defining an elongated centerline extending parallel to the first and second narrow edges of the second dielectric substrate at least near the second transverse plane. The strip conductor of the second transmission line overlies at least a portion of the second broad surface of the second dielectric substrate. The second transition includes a further portion of the ground plane which overlies the entirety of the first broad surface of the second dielectric substrate at locations near the second transverse plane, and overlies only a small portion of the first broad surface of the dielectric substrate adjacent the first narrow edge of the second dielectric substrate at locations near the distal end of the second dielectric substrate. The further portion of the ground plane of the second dielectric substrate includes a taper lying between the second transverse plane and a third horn feed point of the second balanced horn feed near the juncture of the first narrow edge and the distal end of the second dielectric substrate. The second transition also includes a further portion of the strip conductor of the second transmission line, on the second side of the second dielectric substrate. The further portion of the strip conductor of the second transmission line defines a centerline which extends, at an angle relative to the centerline of the strip conductor of the second transmission line, toward the second narrow edge of the second dielectric substrate. The further portion of the strip conductor of the second transition tapers from a first width equal to the width of the strip conductor in the second transmission line at locations near the third transverse plane, to a second width, greater than the first width, adjacent the second narrow edge of the second dielectric substrate. The further portion of the strip conductor of the second transition includes a portion which extends to a fourth horn feed point of the balanced second horn feed near the juncture of the second narrow edge and the distal end of the second dielectric substrate.

Another aspect of the invention includes a radiator including first and second electrically conductive, mutually insulated conductor plates, together defining a radiating aperture and a feed end at which the two plates terminate at a feed plane, the radiator being symmetrical about a plane of symmetry which bisects the first and second plates. This aspect includes a first microstrip-to-balanced transition including a microstrip port and a pair of balanced terminals, a first of the balanced terminals of the first microstrip-to-balanced transition is connected to the first plate on a first side of the plane of symmetry, and a second of the balanced terminals of the first microstrip-to-balanced transition is connected to the second plate on the first side of the plane of symmetry. A second microstrip-to-balanced transition includes a microstrip port and a pair of balanced terminals. A first of the balanced terminals of the second microstrip-to-balanced transition is connected to the first plate of the horn on a second side of the plane of symmetry. The second of the balanced terminals of the second microstrip-to-balanced transition is connected to the second plate on the second side of the plane of symmetry. In a particular application according to this aspect of the invention, the antenna element is associated with either a source or a sink of signal. A power splitter/combiner is coupled to the microstrip ports of the first and second microstrip-to-balanced transitions and to the source or sink of signal, for coupling signal to be transmitted from the source to the radiator when a source is used, and for coupling received signal from the radiator to the sink when a sink is used. In one application according to the invention, there are two sources or two sinks of signal. A first coupler is coupled to the microstrip port of the first microstrip-to-balanced transition and to the first source or sink of signal, and a second coupler is coupled to the second source or sink.

In such an arrangement, signals from the first and second sources are coupled to the radiator for radiation, or signals received by the radiator are coupled to the first and second sinks.

DESCRIPTION OF THE INVENTION

Figure 1A:
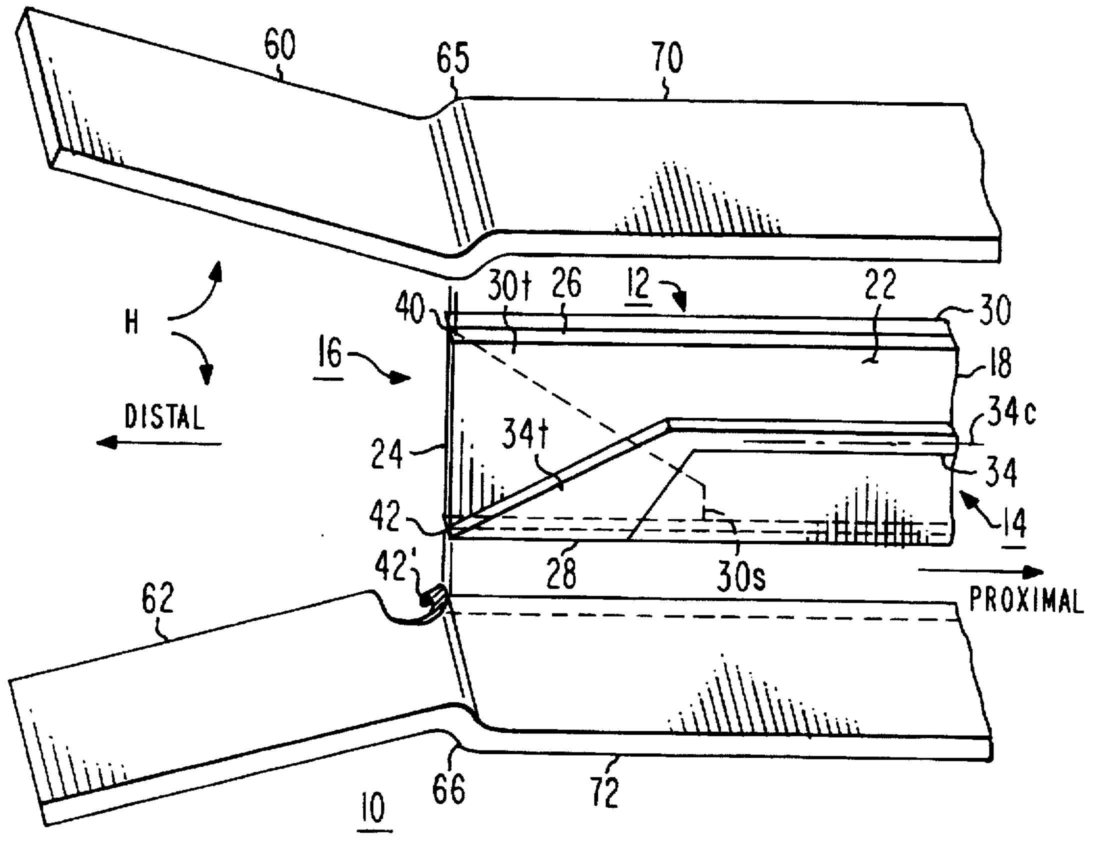
FIG. 1*a* is a simplified, partially exploded, perspective or isometric view of an antenna element according to an aspect of the invention, partially cut away to reveal regions otherwise not viewable.

In FIGS. 1*a*, 1*b*, 1*c*, and 1*d*, an antenna element 10 includes a feed arrangement 12, which includes a feed transmission line portion 14 and a balun or balanced-to-unbalanced transition 16, both mounted on a dielectric substrate 18. Substrate 18 is generally rectangular in shape in the regions of interest, and defines a first broad surface 20, a second broad surface 22 parallel to surface 20, a distal end 24, and first and second narrow edges 26 and 28.

The term "feed" in the context of antennas has a meaning which is slightly different from its apparent meaning. An antenna is a reciprocal device, operating in the same manner in both transmitting and receiving modes of operation to transduce energy between unconstrained or unguided radiation in space and guided waves, and presenting the same impedance at its terminals, and producing the same radiation pattern, and having the same gain, in both transmitting and receiving modes of operation. However, for historical reasons, the antenna connection terminals, whether used for transmission or reception, are denominated as "feed" terminals.

In the arrangement of FIGS. 1*a*, 1*b*, 1*c*, and 1*d*, the transmission-line portion of the feed 12 lies on the proximal side of a transverse plane illustrated as 38. Transverse plane 38 corresponds to the plane at which the conductive strip 34 of the transmission line 14 makes a transition from a constant width $w_r$ (to the right of plane 38 in FIG. 1*b*) to a tapered width (to the left of plane 38 in FIG. 1*b*). The strip conductor 34 lies on the second side 22 of the dielectric substrate 18, and defines an axis of elongation or a centerline 34*c*, which is illustrated as being centered between upper narrow edge 26 and lower narrow edge 28 of the dielectric substrate 18. Transmission line 14 also includes an electrically conductive ground or ground plane 30 lying on the first broad surface 20 of the dielectric substrate 18. The ground plane 30 covers the entire first broad side 20, from first narrow edge 26 to second narrow edge 28, in all regions to the right of plane 32 in FIG. 1*b*. Those skilled in the art will recognize the structure of strip conductor 34 and ground plane 30 as together defining a microstrip transmission line, which is categorized as an "unbalanced" transmission-line arrangement, because the two conductors are of different sizes and configurations.

Balun or transition 16 of feed 12 of the arrangement of FIGS. 1*a*, 1*b*, 1*c*, and 1*d* is mounted on the same dielectric substrate 18 as the transmission line portion 14 of the feed 12.

More particularly, the transition 16 makes a broadband transition from the unbalanced microstrip transmission line 14 to balanced feed terminals 40 and 42. One of the characteristics of such a transition is that the electric fields do not encounter any sudden changes in the impedance or configuration along the length of the transition, but rather, the changes in impedance and configuration occur in a manner which is distributed along the length of the transition. This distribution, and the lack of sudden changes in configuration, makes it difficult to identify the exact "point" at which the transition begins. For example, the absolute symmetry of the transmission line of the arrangement of FIGS. 1*a*, 1*b*, 1*c*, and 1*d* begins to change at transverse plane 38, where the strip conductor 34 begins to grow in transverse dimension relative to its transverse dimension or width. Those skilled in the art know that a change in the ground plane at a location distant from the strip conductor makes almost no difference to the propagation on the transmission line at that plane. Thus, the transition may be said to formally begin at plane 38, where the strip conductor 34 makes a transition between a taper and a constant width $w_r$. However, the changes in the ground plane do not begin in the transition 16 until a transverse plane 32, and the changes in the ground plane aid in the transformation. With this caveat that the exact location of the unbalanced end of the transition 16 is not well defined, the explanation can proceed.

Figure 1B:
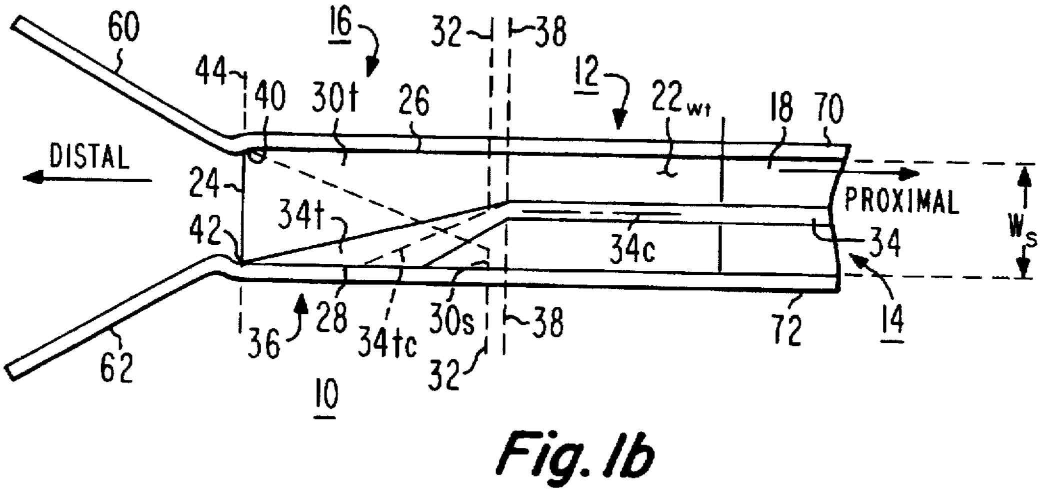
FIG. 1*b* and 1*c* are side elevation views of the assembled antenna of FIG. 1*a*.
Figure 1C:
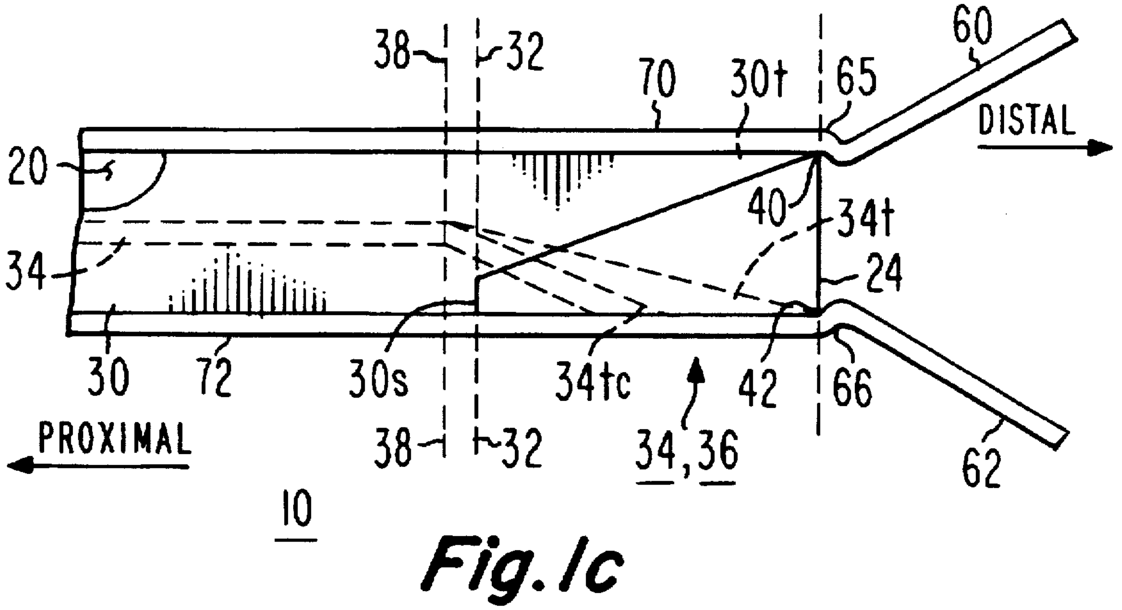
Figure 1D:
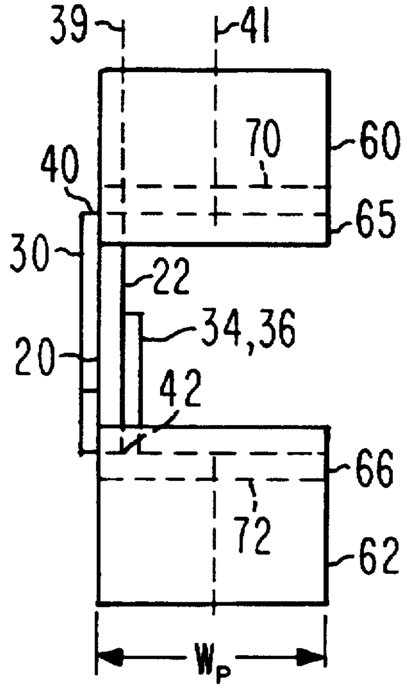
FIG. 1*d* is a view of the assembled antenna of FIG. 1*a* as seen from the radiating aperture.

The ground plane portion 30*t* of transition 16 is connected to, and electrically continuous with, ground plane 30 of the transmission-line portion 14 of feed 12. As illustrated in FIGS. 1*a*, 1*b*, and 1*c*, the transition ground plane portion 30*t* makes a step 30*s* away from the lower narrow edge 28 at transverse plane 32, and from that plane makes a linear taper, becoming progressively narrower in width as the distance from transverse planes 32 and 38 increases, until it tapers down to a point 40. Point 40 of the transition ground plane 30*t* defines one of the balanced terminals of transition 16. As also illustrated in FIGS. 1*a*, 1*b*, and 1*c*, the transition strip conductor centerline 34*fc* changes direction relative to transmission line center conductor 34 centerline 34*c*. More particularly, as the transition strip conductor 34*f* proceeds to the left from transverse plane 38 in FIG. 1*b*, it also proceeds downward at an angle toward the lower narrow edge 28, tapering to a point at lower feed point 42 adjacent to distal end 24 of the dielectric substrate 18. In general, the downward angle of transition strip conductor 34*f* as illustrated in FIG. 1*b* is about equal to the upward angle of ground plane portion 30*t*. Those skilled in the art will recognize transition 16 as being reminiscent of a microstrip-to-coplanar waveguide transition, with the balanced terminals 40 and 42 being at the "coplanar waveguide" side of the transition.

As further illustrated in FIGS. 1*a*, 1*b*, 1*c*, and 1*d*, an upper horn plate 60 is connected to upper balanced terminal 40 of balun 16, and a lower horn plate 62 is connected to lower balanced terminal 42. The upper and lower horn plates together define a flared horn H. Lower horn plate 62 connects to balanced terminal 42 at a location indicated as 42, which lies on the far side of horn plate 62 in the position indicated in FIG. 1*a*. Upper horn plate 60 is energized by a connection to balanced terminal 40 which is similarly offset from the centerline of the horn plate. Thus, the energization of the horn including plates 60 and 62 is off-center relative to a plane (41 of FIG. 1*d*) which bisects the horn plates 60 and 62. There is no electrically conductive support lying between upper horn plate 60 and lower horn plate 62.

In addition to the horn plates 60 and 62, the structure of antenna element 10 of FIGS. 1*a*, 1*b*, 1*c*, and 1*d* includes an additional upper plate 70, which is mechanically and electrically continuous with upper horn plate 60 at an offset 65, and which extends from feed plane 44 in a proximal direction, parallel with centerline 34*c*. Similarly, antenna element 10 of FIGS. 1*a*, 1*b*, 1*c*, and 1*d* includes an additional lower plate 72, which is continuous with lower horn plate 62 at an offset 66, and which extends from feed plane 44 in a proximal direction, parallel with centerline 34*c* and with plate 70. Upper plate 70 is connected to ground plane 30 at all locations at which the ground plane is contiguous with the upper plate, which is the entire length of the upper narrow edge 26 of the dielectric support 18. Lower plate 72 is connected to ground plane 30 at all locations at which it is contiguous therewith, namely at locations proximal to transverse plane 32. The upper and lower plates 70 and 72 may be used to provide the support for their corresponding horn plates 60 and 62. The source of support for plates 70 and 72 is not illustrated in FIGS. 1*a*, 1*b*, 1*c*, and 1*d*.

The offsets 65 and 66 tend to narrow the throat of the horn H, and aid in providing impedance matching over a broad bandwidth.

Upper and lower horn plates 60 and 62 of horn H diverge with increasing distance from feed plane 44, with the angle of divergence (if any) being selected, as known in the art, to provide the appropriate impedance and beam pattern. The most distal end of the diverging horn plates 60, 62 defines a radiating aperture.

The structure of horn antenna 10 of FIGS. 1*a*, 1*b*, 1*c*, and 1*d* is especially suited for receiving use, as the signals transduced by the horn H are all coupled to a single microstrip transmission line, with little loss or attenuation of the received energy or power, as required for low-noise reception.

Another major advantage of the structure illustrated in conjunction with FIGS. 1*a*, 1*b*, 1*c*, and 1*d* is that the transmission line, the transition, and the horn H operate in a transverse electromagnetic (TEM) mode. The horn H defined by the upper and lower horn plates 60, 62 is not limited in frequency, but consists merely of diverging plates which define a radiating aperture. Such a horn can theoretically be used at any frequency, although two practical limitations apply when the horn is used in an array, namely that the axial length of the horn flare should be at least one-quarter wavelength (λ/4) at the lowest frequency of operation to provide relatively low mismatch at low scan angles. The axial length of the horn, however, if made too large, blocks the aperture when used at large scan angles in an array, and thus degrades performance. The horn dimensions can be selected to provide a particular aperture characteristic impedance. Impedances near 50 ohms make the transition to 50-ohm microstrip easy, while higher impedances make matching to free space easier. The microstrip transmission line 14 has a very broad frequency range, as does the transition. Thus, the combination of elements as illustrated has a very broad frequency range.

Figure 2A:
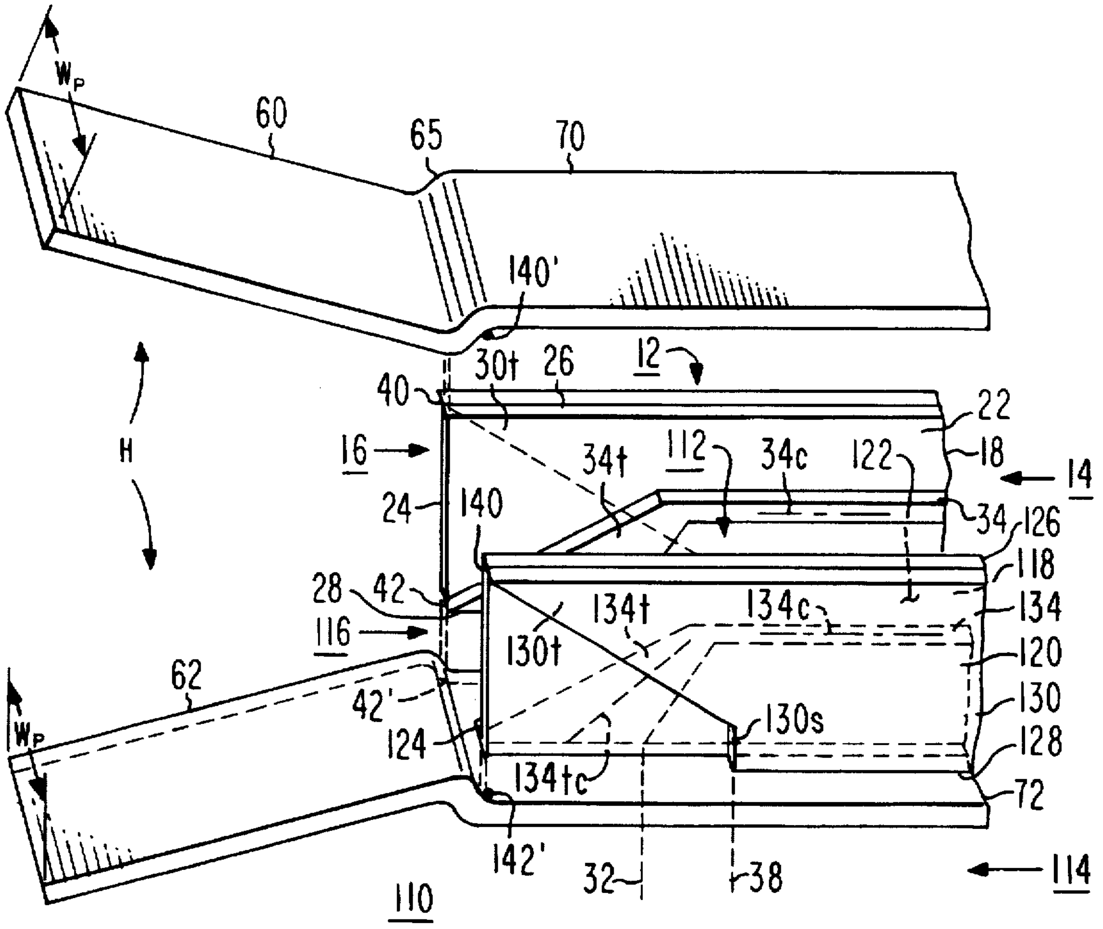
FIG. 2*a* is a perspective or isometric view, partially exploded to reveal details of the relationship between elements, of an antenna element similar to that of FIGS. 1*a*, 1*b*, 1*c*, and 1*d*.

The preferred embodiment for use in a transmitting mode provides two or more feeds to the horn plates. FIG. 2*a* is a perspective or isometric view, partially exploded to reveal details of the relationship between elements, of an antenna element similar to that of FIGS. 1*a*, 1*b*, 1*c*, and 1*d*, with an additional feed element.

Figure 2B:
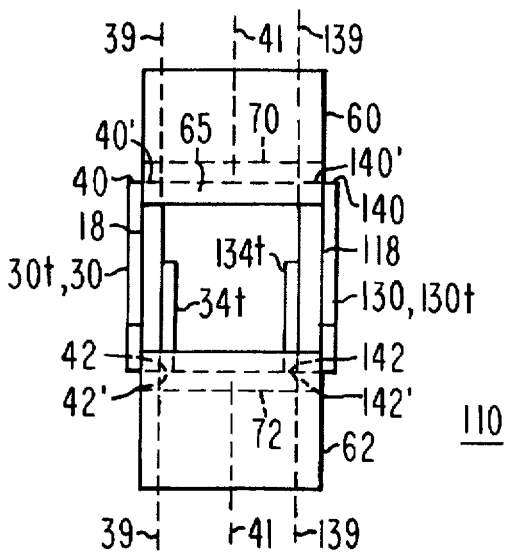
FIG. 2*b* is an end view, from the radiating end of the horn, of the structure of FIG. 2*a*.

FIG. 2*b* is an end view, from the radiating end of the horn, of the structure of FIG. 2*a*. Elements of FIGS. 1*a*, 1*b*, 1*c*, and 1*d* which appear in FIGS. 2*a* and 2*b* are designated by like reference numerals, and elements of the additional feed are denominated by like reference numerals in the 100 series. Thus, in FIG. 2*a*, a second feed 112, which includes a feed transmission line portion 114 and a balun or balanced-to-unbalanced transition 116, both mounted on a dielectric substrate 118. Substrate 118 is generally rectangular in shape in the regions of interest, and defines a first broad surface 120, a second broad surface 122 parallel to surface 120, a distal end 124, and first and second narrow edges 126 and 128.

In the arrangement of FIG. 2*a*, the transmission-line portion of the feed 112 lies on the proximal side of transverse plane 38. Transverse plane 38 corresponds to the plane at which the conductive strip 34 of the transmission line 14 of feed 12 makes a transition from a constant width wt to a tapered width, as described in conjunction with FIGS. 1*a*, 1*b*, 1*c*, and 1*d*. The strip conductor 34 or transmissionline portion 114 of feed 112 lies on the second side 122 of the dielectric substrate 118, and defines an axis of elongation or a centerline 134*c*, which is illustrated as being centered between upper narrow edge 126 and lower narrow edge 128 of the dielectric substrate 118. Transmission line 114 also includes an electrically conductive ground plane 130 lying on the first broad surface 120 of the dielectric substrate 118. The ground plane 130 covers the entire first broad side 120, from first narrow edge 126 to second narrow edge 128, in all regions proximal to plane 32, which is as described above in conjunction with FIGS. 1*a*, 1*b*, 1*c*, and 1*d*.

Balun or transition 116 of feed 112 of the arrangement of FIG. 2*a* is mounted on the same dielectric substrate 118 as the transmission line portion 114 of the feed 112. As in the case of feed 12, transition 116 makes a broadband transition from the unbalanced microstrip transmission line 114 to balanced feed terminals 140 and 142. The ground plane portion 130*t* of transition 116 of FIG. 2*a* is connected to, and electrically continuous with, ground plane 130 of the transmission-line portion 114 of feed 112. As illustrated in FIG. 2*a*, and as described in conjunction with the corresponding structure of FIGS. 1*a*, 1*b*, and 1*c*, the transition ground plane portion 130*t* makes a step 130*s* away from the lower narrow edge 128 at transverse plane 38, and from that plane makes a linear taper, becoming progressively narrower in width as the distal distance from transverse plane 38 increases, until it tapers down to a point 140. Point 140 of the transition ground plane 130*t* defines one of the balanced terminals of transition 116. As also illustrated in FIG. 2*a*, the transition strip conductor centerline 134*tc* changes direction relative to transmission line center conductor 134 centerline 134*c*. More particularly, as the transition strip conductor 134*t* proceeds to the left from transverse plane 38 in FIG. 2*a*, it also proceeds downward at an angle toward the lower narrow edge 128, tapering to a point at lower feed point 142 adjacent to distal end 124 of the dielectric substrate 118. In general, the downward angle of transition strip conductor 134*t* as illustrated in FIG. 2*a* is about equal to the upward angle of ground plane portion 130*t*.

The connections between the balanced feed points 40, 42; 140, 142 and the corresponding points, including points 42', 140', and 142' are not illustrated in FIG. 2*a*. It will be understood that balanced feed points 40, 42; 140, 142 are connected to horn feed points 42', 140', and 142', respectively, and that balanced feed point 40 is connected to a corresponding point 40' on upper horn plate 60, as illustrated in more detail in FIG. 2*b*. In the radiating-end view of the horn and feeds of FIG. 2*b*, it can be seen that the first balanced feed points 40, 42 lie in a vertically oriented longitudinal plane 39, while the second set of balanced feed points 140' and 142' lies in a vertically oriented longitudinal plane 139. These two feed planes are located on laterally opposite sides of the horn plates.

Figure 3A:
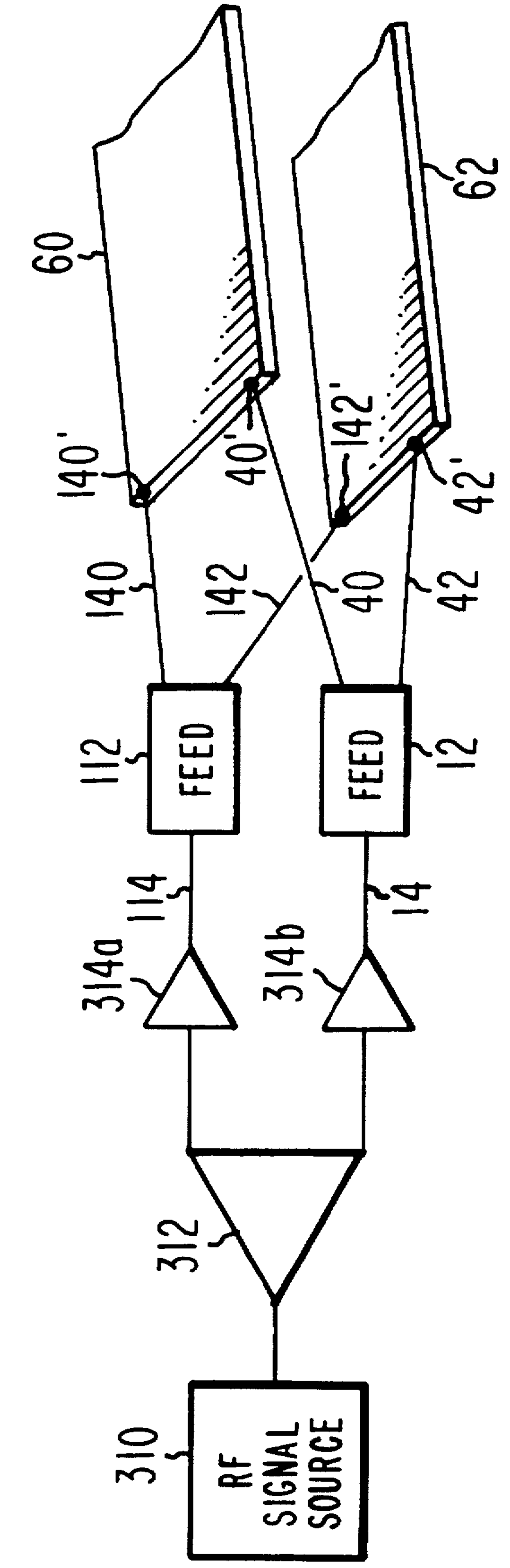
FIG. 3*a* is a simplified block diagram illustrating how plural amplifiers can drive the antenna of FIGS. 2*a* and 2*b* with a signal which is combined for radiation.

FIG. 3*a* illustrates how two separate power amplifiers can energize the horn element 110 of FIGS. 2*a* and 2*b* with the same signal. In FIG. 3*a*, a source 310 of radio-frequency (RF) signal is coupled to a power divider or splitter 312, which divides the signal into two parts, which are preferably equal in amplitude and phase. The two signals are applied to the input ports of two amplifiers 314*a* and 314*b*, which amplify the signals, and which have microstrip output ports, as well known in the art. The microstrip output ports of the amplifiers are coupled to the microstrip transmission lines 14 and 114, for driving the feeds 12 and 112, respectively. The feeds 12 and 112 are illustrated simply as blocks, which convert the signals to balanced form, and apply the two signals separately to the horn consisting of plates 60 and 62. More particularly, as described above, balanced feed points 40 and 42 are coupled to horn feed points 40' and 42', respectively, and balanced feed points 140 and 142 are coupled to horn feed points 140' and 142'.

The amplitude and phase of the signals traversing the amplifiers should be controlled, as known, to achieve optimal results. The power generated by the two amplifiers is combined in the horn antenna itself.

Figure 3B:
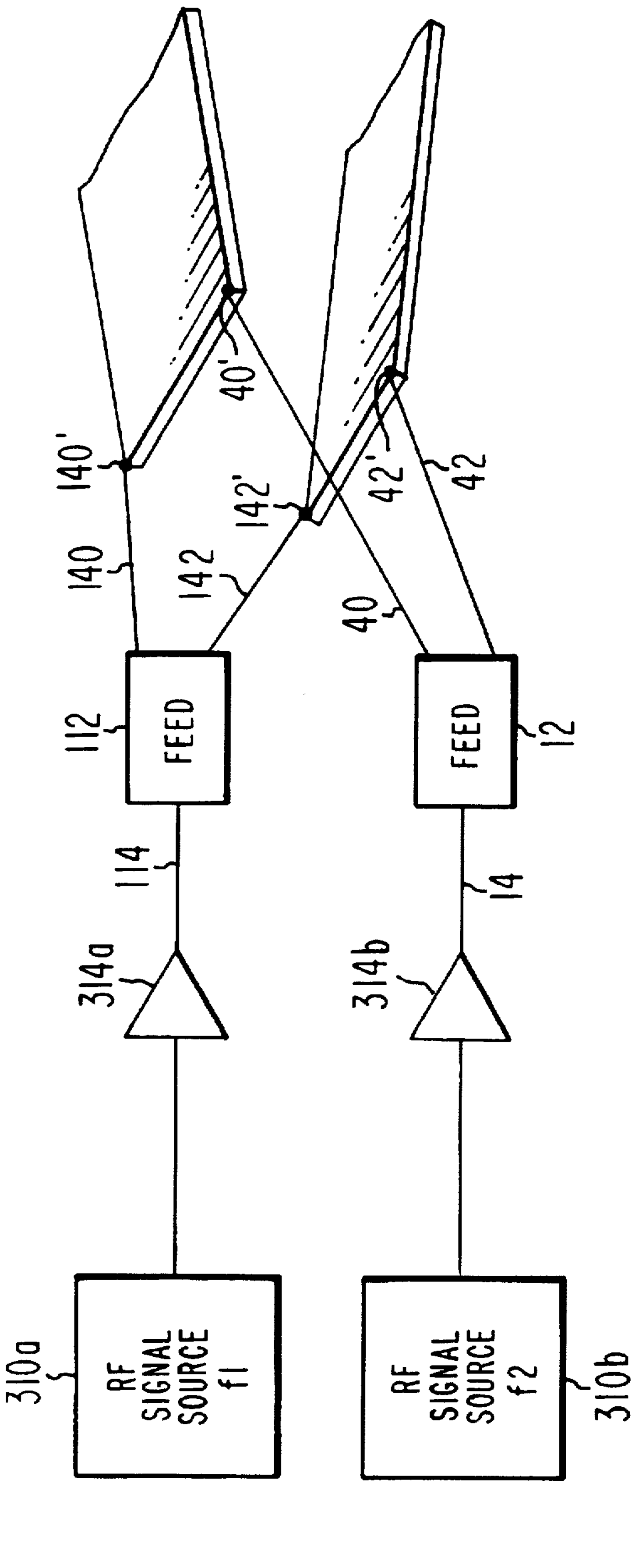
FIG. 3*b* is a simplified block diagram illustrating an arrangement by which plural signals can be combined for radiation.

FIG. 3*b* is a simplified block diagram of an arrangement by which different signals can be combined or multiplexed onto the same horn for radiation thereby. In FIG. 3*b*, a first RF signal source 350 produces signal at a frequency f1, and a second RF signal source 352 produces signal at a frequency f2. The f1 signal is applied from source 350 to the input port of amplifier 314*a*, and the f2 signal is applied from signal source 352 to the input port of amplifier 314*b*. The amplifiers amplify their respective signals, and apply them over microstrip transmission lines 14 and 114 to feeds 12 and 112, respectively. The feeds are connected as described at length above, with the result that frequency f1 drives the horn H at feed points 140' and 142', while frequency f2 drives horn H at feed points 40' and 42. These two signals are radiated by the horn independently, or in other words the horn treats each signal as though the other signal were absent, so that the horn aperture can be used for multiple signals.

Figure 4:
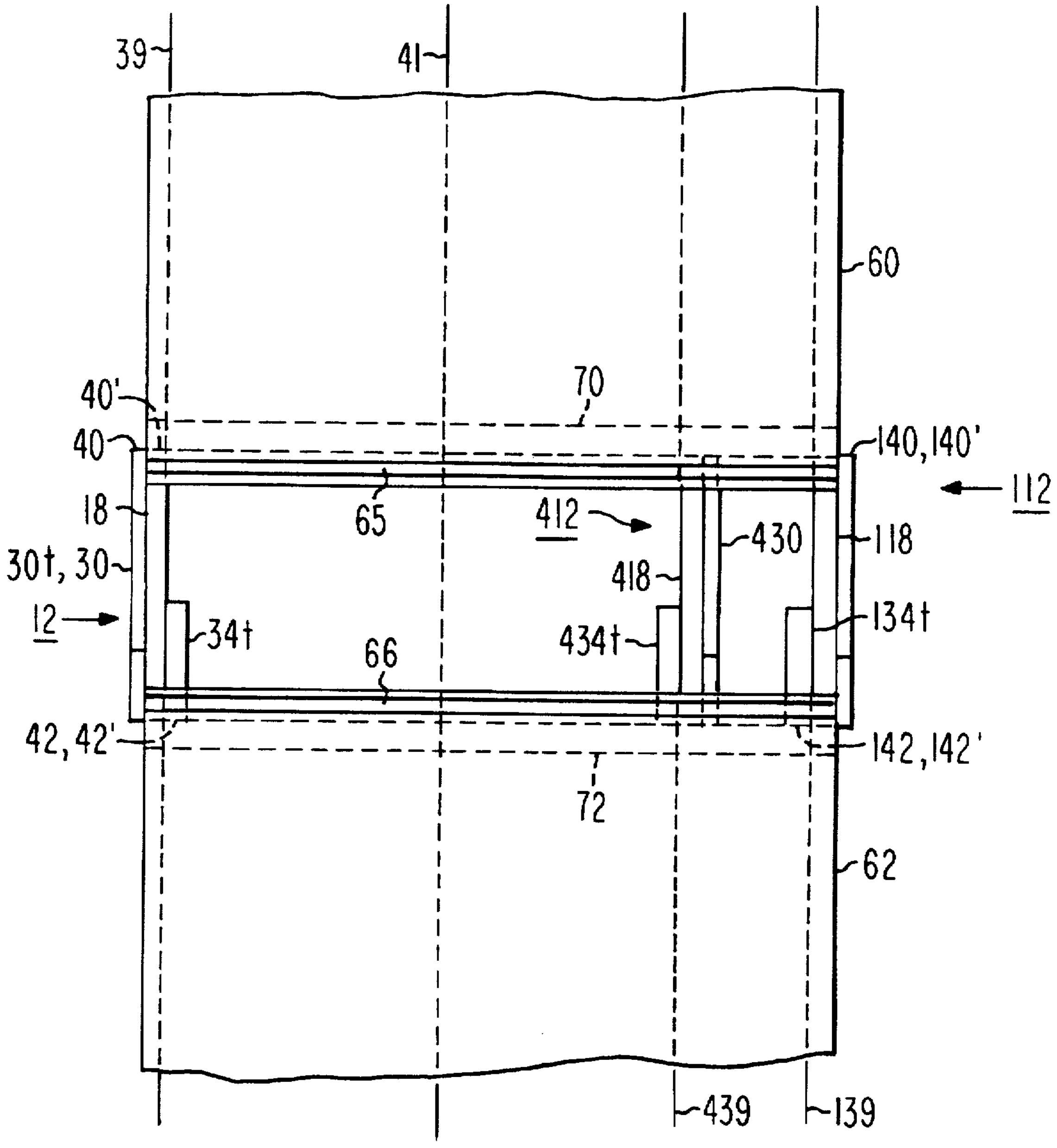
FIG. 4 is a simplified radiating-end view of another embodiment of the invention, in which additional feeds are provided for the same horn.

While one and two feeds have been illustrated, it should be possible to provide additional feeds, as suggested by the radiating end view of FIG. 4. In FIG. 4, an additional feed arrangement 412 is associated with an additional vertically oriented transverse plane 439 in a structure otherwise identical to that of FIGS. 2a and 2b. Feed 412 includes a dielectric substrate 418, a ground plane 430, and a transition strip conductor 434t, corresponding exactly to those of the other feeds 12, 112. It will be apparent that other such feeds may be added. Preferably, such additional feeds are added in pairs, symmetrically disposed about horn plate bisector plane 41. With such an arrangement, the outputs of multiple amplifiers can be combined at the antenna.

As so far described, the support for the horn plates 60, 62 of horn H has not been discussed, except to say that support may be provided by the top and bottom plates 70 and 72.

Figure 5:
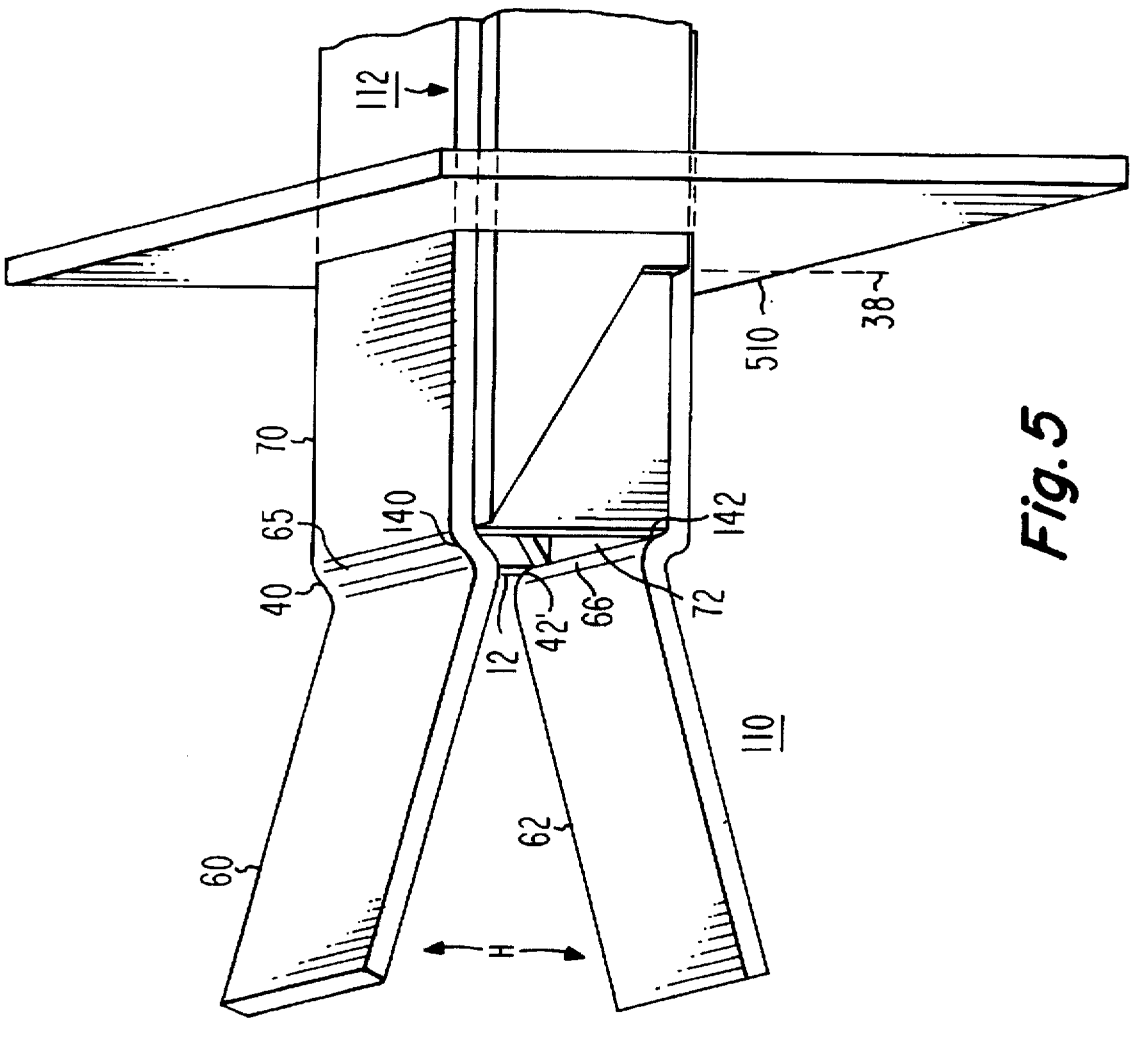
FIG. 5 is a perspective or isometric view of an antenna such as that of FIGS. 2*a* and 2*b* in its assembled form, with a support plate.

FIG. 5 is a simplified illustration of a horn antenna arrangement such as that of FIG. 2a and 2b, with corresponding parts designated by the same reference numerals. In FIG. 5, an electrically conductive support plate 510 surrounds the structure of antenna 110 near plane 38 at which the step 30s, 130s occurs in the ground plane 30 of the feeds, and is connected to the ground planes 30, 130, and to the upper and lower plates 70, 72. Plate 510 can lie on plane 38, but is illustrated somewhat separated therefrom, to emphasize that the support plate can lie at any position proximal to plane 38. Support plate 510 prevents electromagnetic radiation from proceeding toward the proximal portion of the feed structure by paths outside the horn and feed structure 110. While energy can theoretically enter the "tunnel" lying between upper and lower plates 70, 72 and the ground planes 30, 130, without coupling to the feed structure, such frequencies are expected to be too high to be of any interest.

Figure 6:
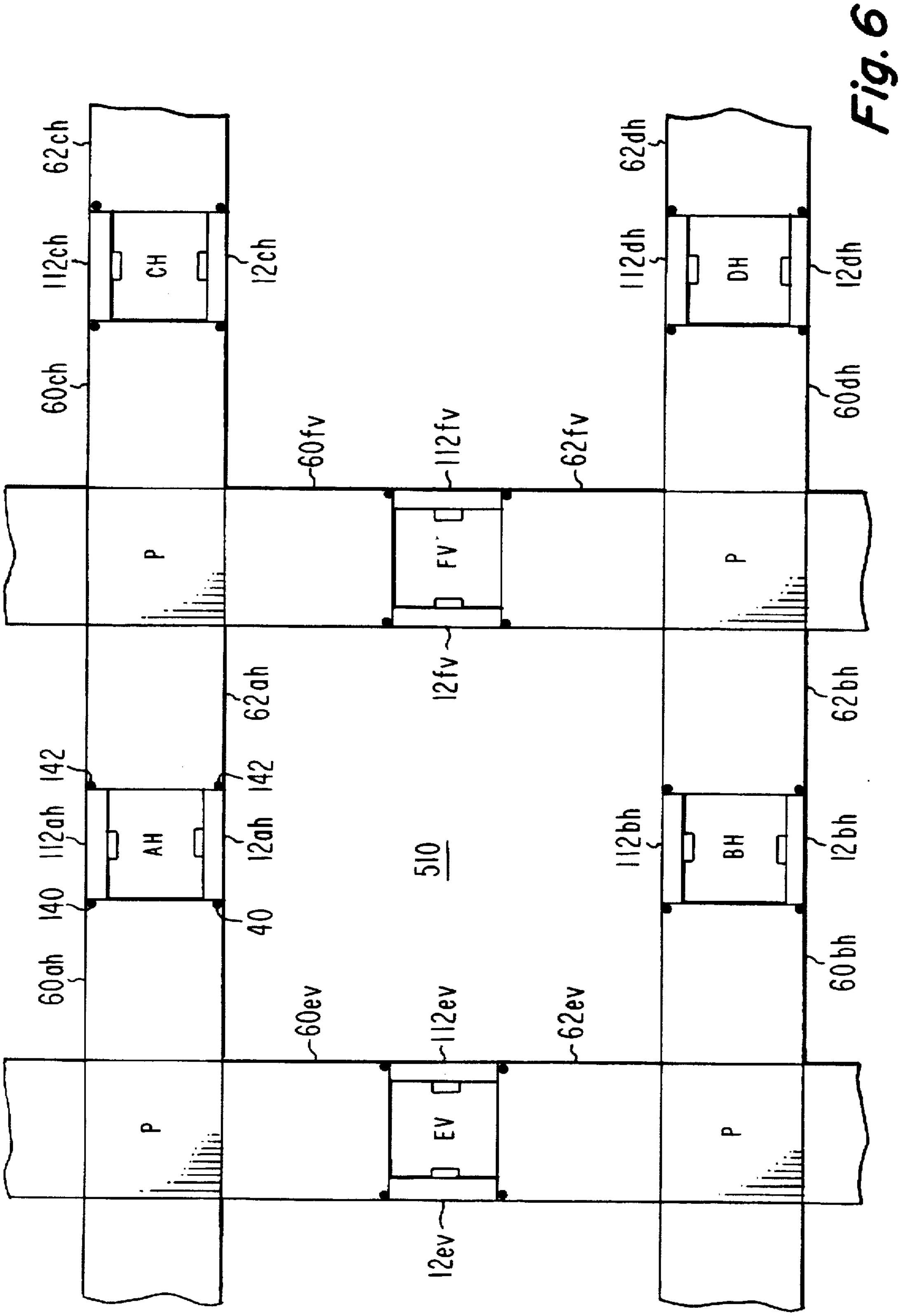
FIG. 6 is a representation, looking into the radiating apertures, of a portion of an array using a plurality of elements such as that of FIG. 5.

FIG. 6 is a radiating-end view of a portion of an array of vertically and horizontally polarized antenna elements similar to that of FIG. 5, all of which are supported by a plate 510. The plate 510 lies in the plane of the FIGURE, and is the most remote portion of the array relative to the viewer. Four complete antennas are illustrated in FIG. 6, and major portions of two other antennas are illustrated, for a total of six, although minor portions of yet others are also illustrated. In FIG. 6, the antennas are designated as A, B, C, D, E, and F. The designations also include reference to the polarization of the particular antenna, either V or H. Thus, at the top center of FIG. 6 lie the feed points of antenna AH, and its horn plates 60ah and 62ah lie to the left and right, respectively, of the feed structure. The feed structure of horn AH illustrates feed structure 12ah with its balanced feed points 40 and 42, and also illustrates feed structure 112ah with its feed points 140 and 142. Similarly, at the bottom center of FIG. 6 lie the feed points of antenna BH, and its horn plates 60bh and 62bh lie to the left and right, respectively, of the feed structure. The structure of antenna BH includes feed 12bh and feed 112bh. The upper right of FIG. 6 shows a portion of another horizontally polarized antenna CH, with its horn plate 60ch at its left, and a portion of its other horn plate 62ch at its right, and its feeds 12ch and 112ch.

At bottom right of FIG. 6, the feed structure of antenna DH includes feed 12dh and 112dh, and has its horn plate 60dh at its left, and a portion of its horn plate 62dh at its right. The vertically oriented antennas of the portion of the array illustrated in FIG. 6 are EV and FV.

Horn antenna EV includes feeds 12ev and 112ev, and also includes horn plate 60ev above the feed structure, and horn plate 62ev below. Similarly, horn antenna FV includes feeds 12fv and 112fv, and also includes horn plates 60fv above, and 62fv below.

Figure 7:
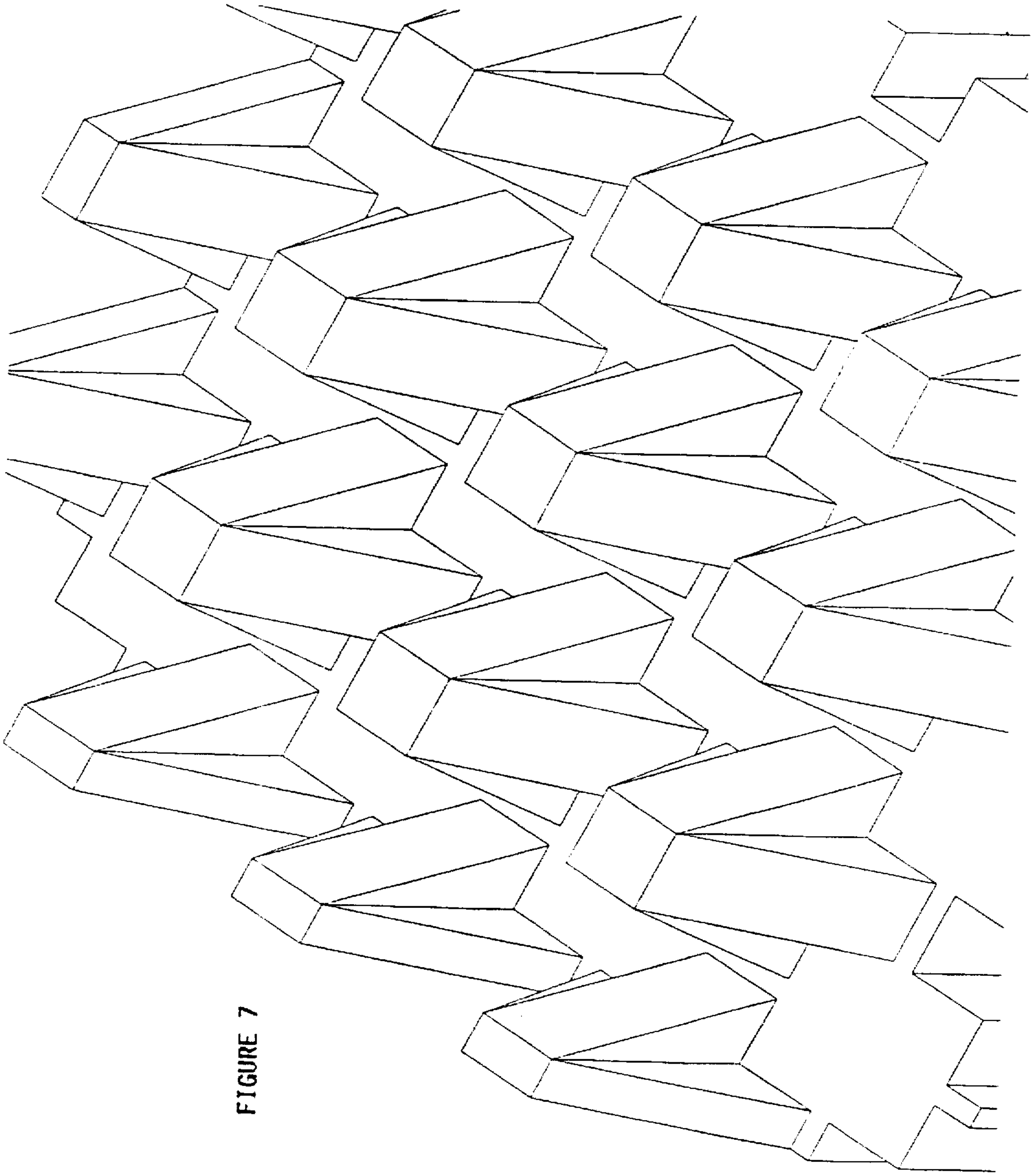
FIG. 7 is a computer-generated perspective or isometric view of a portion of an array such as that of FIG. 7.

In the arrangement of the array of FIG. 6, the feed structures are near the lowest part of the illustration, either in the plane of support plate 510, or above or below the support plate by some small amount, as described in conjunction with FIG. 5. The highest portions of the structure illustrated in FIG. 6 are the square peaks illustrated by the designation P, which are plates, placed parallel to the support plate 510, connecting the ends of the various horn plates. This structure is illustrated in a computer-generated perspective or isometric view in FIG. 7. It will be noted that the structure of FIG. 7 includes a plurality of metallic peaks or protuberances, connected together for mutual structural support, all supported by support plate 510. There are no openings in the structure except in the "throat" of each horn antenna. These throats can be fitted with closure plates which seal off the throats near the transmission lines, so long as they do not excessively perturb the impedances of the microstrip transmission lines. Such sealing arrangements are well known in the art.

Other embodiments of the invention will be apparent to those skilled in the art. For example, while linear tapers have been described, they could be exponential, or follow any other mathematical function. While the strip conductor 34 of the transmission line 14 of FIGS. 1a, 1b, and 1c is illustrated as being straight, the whole point of a transmission line is to carry energy from one location to another, and for this purpose, the strip conductor may be curved, or contain bends, as required to take energy to the desired location from its source.

Thus, an antenna element (10) according to an aspect of the invention includes a first feed (12) structure including a transition (16) between a balanced horn feed (40, 42), lying in a transverse horn feed plane (44), and a transmission line (14) located proximally relative to the horn feed plane (44). The first feed (12) structure includes a rectangular dielectric substrate (18) defining first (20) and second (22) mutually parallel broad surfaces, first (26) and second (28) mutually parallel narrow edges separated by a substrate width, and a distal end (24) lying in, and orthogonal to, the horn feed plane (44). The transmission line (14) includes (a) an electrically conductive ground plane (30), and a strip conductor (34). The conductive ground plane (30) overlies the entirety of the first broad surface (20) of the dielectric substrate (18) at locations lying between the first (26) and second (28) narrow edges of the dielectric substrate (18), at locations more proximal than a second transverse plane (32) orthogonal to the first (20) and second (22) broad surfaces. The second transverse plane (32) is located proximally relative to the horn feed plane (44). The strip conductor defined by the transmission line also defines an elongated centerline (34c) extending parallel to the first (26) and second (28) narrow edges of the dielectric substrate (18), at least near the second transverse plane (32). The strip conductor (34) overlies at least a portion of the second broad surface (22). The transition (16) includes a further portion (30t) of the ground plane (30) which overlies the entirety of the first broad surface (20) of the dielectric substrate (18) at locations near the second transverse plane (32), and overlies only a small portion of the first broad surface (20) of the dielectric substrate (18) adjacent the first narrow edge (26) of the dielectric substrate (18) at locations near the distal end (24) of the dielectric substrate (18). The further portion (30*t*) of the ground plane (30) defines a taper lying between the second transverse plane (32) and a first horn feed point (40) of the balanced horn feed (40, 42) near the juncture of the first narrow edge (26) and the distal end (24) of the dielectric substrate (18). The transition (16) also includes a further portion (34*t*) of the strip conductor (34), on the second side (22) of the dielectric substrate (18). The further portion (34*t*) of the strip conductor (34) defines a centerline (34*tc*) which extends, at an angle relative to the centerline (34*c*) of the strip conductor (34) of the transmission line (14), toward the second narrow edge (28) of the dielectric substrate (18). The further portion (34*t*) of the strip conductor (34) tapers from a first width to a second width. The first width is equal to the width of the strip conductor (34) in the transmission line (14) at locations near a third transverse plane (38), which third transverse plane (38) is no more proximal than the second transverse plane (32). The second width is greater than the first width at locations adjacent the second narrow edge (28) of the dielectric substrate (18). The further portion (34*t*) of the strip conductor (34) includes a portion which extends to a second horn feed point (42) of the balanced horn feed (40, 42) near the juncture of the second narrow edge (28) and the distal end (24) of the dielectric substrate (18). As a result of this structure, the transition (16) transitions between a balanced electric field state at the first (40) and second (42) horn feed points and an unbalanced electric field state in the transmission line (14), and physically rotates an electric field between its balanced and unbalanced states. The antenna element also includes electrically conductive first (60) and second (62) horn plates connected to the first (40) and second (42) horn feed points, respectively. The first (60) and second (62) horn plates are separated, at the horn feed plane (44), by a distance equal to the substrate width ($w_s$), and diverge with increasing distance in the distal direction from the horn feed plane (44), so as to be separated by a distance greater than the substrate width ($w_s$) at locations remote from the horn feed plane (44).

In a particular embodiment of the invention, the taper of the ground plane (30) portion (30*t*) in the transition (16) is a linear taper. In another embodiment, the centerline (34*c*) of the strip conductor (34) in the transmission line (14) is centered between the first (26) and second (28) narrow edges of the dielectric substrate (18), at least near the third transverse plane (38). In yet another embodiment, the antenna element further comprises electrically conductive top (70) and bottom (72) plates. The top plate (70) is in contact with the first horn plate (60) at the horn feed plane (44), and extends proximally, parallel to the centerline 34*c* of the strip conductor (34), in galvanic contact with the ground plane (30) of the transmission line (14). The bottom plate (72) is in contact with the second horn plate (62) at the horn feed plane (44), and extends proximally, parallel to the centerline 34*c* of the strip conductor (34), in galvanic contact with the ground plane (30) of the transmission line (14).

In a more particular embodiment, the first (60) and second (62) horn plates have a predetermined width ($w_p$) in a direction transverse to the centerline (34*c*) of the strip conductor (34), and the first (40) and second (42) horn feed points of the first feed (12) are affixed to the first (60) and second (62) horn plates in a first longitudinal plane (39) substantially coincident with the dielectric substrate. This embodiment further comprises a second feed (112) including a second transition (116) between a second balanced horn feed (140, 142) lying in the transverse horn feed plane (44), and a second transmission line (114) located proximally relative to the horn feed plane (44). The second feed (112) includes a rectangular second dielectric substrate (118) defining first (120) and second (122) mutually parallel broad surfaces, first (126) and second (128) mutually parallel narrow edges separated by a substrate width, and a distal end (124) lying in, and orthogonal to, the horn feed plane (44).

The second transmission line (114) includes (a) an electrically conductive ground plane (130) overlying the entirety of the first broad surface (120) of the second dielectric substrate (118) lying between the first (126) and second (128) narrow edges of the second dielectric substrate (118) at locations more proximal than the second transverse plane (32). The second transmission line (144) also includes a strip conductor (134) defining an elongated centerline (134*c*) extending parallel to the first (126) and second (128) narrow edges of the second dielectric substrate (118) at least near the second transverse plane.

The strip conductor (134) of the second transmission line (114) overlies at least a portion of the second broad surface (122) of the second dielectric substrate (118). The second transition (116) includes a further portion (130*t*) of the ground plane (130) which overlies the entirety of the first broad surface (120) of the second dielectric substrate (118) at locations near the second transverse plane (32), and overlies only a small portion of the first broad surface (120) of the dielectric substrate (118) adjacent the first narrow edge (26) of the second dielectric substrate (118) at locations near the distal end (124) of the second dielectric substrate (118). The further portion (130*t*) of the ground plane (130) of the second dielectric substrate (118) includes a taper lying between the second transverse plane (32) and a third horn feed point (140) of the second balanced horn feed (140, 142) near the juncture of the first narrow edge (126) and the distal end (124) of the second dielectric substrate (118). The second transition (116) also includes a further portion (134*t*) of the strip conductor (34) of the second transmission line (114), on the second side (122) of the second dielectric substrate (118). The further portion (134*t*) of the strip conductor (134) of the second transmission line (114) defines a centerline (134*tc*) which extends, at an angle relative to the centerline (134*c*) of the strip conductor (134) of the second transmission line (114), toward the second narrow edge (128) of the second dielectric substrate (118). The further portion (134*t*) of the strip conductor (134) of the second transition (116) tapers from a first width ($w_t$) equal to the width of the strip conductor (134) in the second transmission line (114) at locations near the third transverse plane (38), to a second width, greater than the first width, adjacent the second narrow edge (128) of the second dielectric substrate (118). The further portion (134*t*) of the strip conductor (134) of the second transition (116) includes a portion which extends to a fourth horn feed point (142) of the balanced second horn feed (140, 142) near the juncture of the second narrow edge (128) and the distal end (124) of the second dielectric substrate (118).

Another aspect of the invention includes a radiator (H) including first (60) and second (62) electrically conductive, mutually insulated conductor plates, together defining a radiating aperture and a feed end at which the two plates terminate at a feed plane (44), the radiator being symmetrical about a plane (41) of symmetry which bisects the first (60) and second (62) plates. This aspect includes a first microstrip-to-balanced transition (12) including a microstrip port (34) and a pair of balanced terminals (40, 42), a first (40) of the balanced terminals of the first microstrip-to-balanced transition (12) is connected to the first plate (60) on a first (left) side of the plane (41) of symmetry, and a second (42) of the balanced terminals of the first microstrip-to-balanced transition (12) is connected to the second plate (62) on the first (left) side of the plane (41) of symmetry. A second microstrip-to-balanced transition (112) includes a microstrip port (34) and a pair (140, 142) of balanced terminals. A first (140) of the balanced terminals of the second microstrip-to-balanced transition (112) is connected to the first plate (60) of the horn (H) on a second (right) side of the plane (41) of symmetry. The second (142) of the balanced terminals of the second microstrip-to-balanced transition (112) is connected to the second plate (62) on the second (right) side of the plane (41) of symmetry. In a particular application according to this aspect of the invention, the radiator (H) is associated with either a source or a sink of signal (310). A power splitter/combiner (312) is coupled (by way of amplifiers 314a and 314b) to the microstrip ports (14, 114) of the first (14) and second (114) microstrip-to-balanced transitions and to the source or sink of signal (310), for coupling signal to be transmitted from the source (310) to the radiator when a source is used, and for coupling received signal from the radiator to the sink (310) when a sink is used. In one application (FIG. 3*b*) according to the invention, there are two sources or two sinks (310a, 310b) of signal. A first coupler (314b) is coupled to the microstrip port (14) of the first microstrip-to-balanced transition (112) and to the first source or sink of signal (310b), and a second coupler (314a) is coupled to the second source or sink (314a). In such an arrangement, signals from the first (314b) and second (314a) sources are coupled to the radiator (H) for radiation, or signals received by the radiator are coupled to the first and second sinks.

What is claimed is:

1. An antenna element, comprising:

a first feed including a transition between a balanced horn feed lying in a transverse horn feed plane and a transmission line located proximally relative to said horn feed plane;

said first feed including a rectangular dielectric substrate defining first and second mutually parallel broad surfaces, first and second mutually parallel narrow edges separated by a substrate width, and a distal end lying in, and orthogonal to, said horn feed plane;

said transmission line including (a) an electrically conductive ground plane overlying the entirety of said first broad surface of said dielectric substrate lying between said first and second narrow edges of said dielectric substrate at locations more proximal than a second transverse plane orthogonal to said first and second broad surfaces, and to said horn feed plane, said second transverse plane being located proximally relative to said horn feed plane, said transmission line also including (b) a strip conductor defining an elongated centerline extending parallel to said first and second narrow edges at least near said second transverse plane, said strip conductor overlying at least a portion of said second broad surface;

said transition including a further portion of said ground plane which overlies said entirety of said first broad surface of said dielectric substrate at locations near said second transverse plane, and overlies only a small portion of said first broad surface of said dielectric substrate adjacent said first narrow edge of said dielectric substrate at locations near said distal end of said dielectric substrate, said further portion of said ground plane defining a taper lying between said second transverse plane and a first horn feed point of said balanced horn feed near the juncture of said first narrow edge and said distal end of said dielectric substrate, said transition also including a further portion of said strip conductor, on said second side of said dielectric substrate, said further portion of said strip conductor defining a centerline which extends, at an angle relative to said centerline of said strip conductor of said transmission line, toward said second narrow edge of said dielectric substrate, said further portion of said strip conductor tapering from a first width equal to said width of said strip conductor in said transmission line at locations near a third transverse plane, which third transverse plane is no more proximal than said second transverse plane, to a second width, greater than said first width, adjacent said second narrow edge of said dielectric substrate, said further portion of said strip conductor having a portion which extends to a second horn feed point of said balanced horn feed near the juncture of said second narrow edge and said distal end of said dielectric substrate, whereby said transition transitions between a balanced electric field state at said first and second horn feed points and an unbalanced electric field state in said transmission line, and physically rotates an electric field between its balanced and unbalanced states;

electrically conductive first and second horn plates connected to said first and second horn feed points, respectively, said first and second horn plates being separated, at said horn feed plane, by a distance equal to said substrate width, and generally diverging with increasing distance in the distal direction from said horn feed plane, so as to be separated by a distance greater than said substrate width at locations remote from said horn feed plane.

2. An element according to claim 1, wherein said taper of said ground plane portion in said transition is a linear taper.

3. An element according to claim 1, wherein said centerline of said strip conductor in said transmission line is centered between said first and second narrow edges of said dielectric substrate, at least near said third transverse plane.

4. An element according to claim 1, further comprising electrically conductive top and bottom plates, said top plate being in contact with said first horn plate at said horn feed plane, and extending proximally, parallel to said centerline 34c of said strip conductor, in galvanic contact with said ground plane of said transmission line, and said bottom plate being in contact with said second horn plate at said horn feed plane, and extending proximally, parallel to said centerline of said strip conductor, in galvanic contact with said ground plane of said transmission line.

5. An element according to claim 1, wherein said first and second horn plates have a predetermined width in a direction transverse to said centerline of said strip conductor, and said first and second horn feed points of said first feed are affixed to said first and second horn plates in a first longitudinal plane substantially coincident with said dielectric substrate; and further comprising:

a second feed including a second transition between a second balanced horn feed lying in said transverse horn feed plane and a second transmission line located proximally relative to said horn feed plane;

said second feed including a rectangular second dielectric substrate defining first and second mutually parallel broad surfaces, first and second mutually parallel narrow edges separated by a substrate width, and a distal end lying in, and orthogonal to, said horn feed plane;

said second transmission line including (a) an electrically conductive ground plane overlying the entirety of said first broad surface of said second dielectric substrate lying between said first and second narrow edges of said second dielectric substrate at locations more proximal than said second transverse plane, and to said horn feed plane, said second transmission line also including (b) a strip conductor defining an elongated centerline extending parallel to said first and second narrow edges of said second dielectric substrate at least near said second transverse plane, said strip conductor of said second transmission line overlying at least a portion of said second broad surface of said second dielectric substrate;

said second transition including a further portion of said ground plane which overlies said entirety of said first broad surface of said second dielectric substrate at locations near said second transverse plane, and overlies only a small portion of said first broad surface of said dielectric substrate adjacent said first narrow edge of said second dielectric substrate at locations near said distal end of said second dielectric substrate, said further portion of said ground plane of said second dielectric substrate including a taper lying between said second transverse plane and a third horn feed point of said second balanced horn feed near the juncture of said first narrow edge and said distal end of said second dielectric substrate, said second transition also including a further portion of said strip conductor of said second transmission line, on said second side of said second dielectric substrate, said further portion of said strip conductor of said second transmission line defining a centerline which extends, at an angle relative to said centerline of said strip conductor of said second transmission line, toward said second narrow edge of said second dielectric substrate, said further portion of said strip conductor of said second transition tapering from a first width equal to said width of said strip conductor in said second transmission line at locations near said third transverse plane, to a second width, greater than said first width, adjacent said second narrow edge of said second dielectric substrate, said further portion of said strip conductor of said second transition having a portion which extends to a fourth horn feed point of said balanced second horn feed near the juncture of said second narrow edge and said distal end of said second dielectric substrate.

6. An antenna element according to claim 1, wherein said first and second horn plates each define a bend adjacent said horn feed plane, in a manner which tends to reduce the spacing between said first and second horn plates at a location adjacent said horn feed plane.

7. An antenna element, comprising:

a radiator including first and second electrically conductive, mutually insulated conductor plates, together defining a radiating aperture and a feed end at which the two plates terminate at a transverse feed plane, said radiator being symmetrical about a plane of symmetry which bisects said first and second plates;

a first microstrip-to-balanced transition including a microstrip port and a pair of balanced terminals, a first of said balanced terminals of said first microstrip-to-balanced transition being connected to said first plate on a first side of said plane of symmetry, and a second of said balanced terminals of said first microstrip-to-balanced transition being connected to said second plate on said first side of said plane of symmetry;

a second microstrip-to-balanced transition including a microstrip port and a pair of balanced terminals, a first of said balanced terminals of said second microstrip-to-balanced transition being connected to said first plate on a second side of said plane of symmetry, and a second of said balanced terminals of said second microstrip-to-balanced transition being connected to said second plate on said second side of said plane of symmetry.

8. An antenna element according to claim 7, further comprising:

one of a source and sink of signal;

power splitting/combining means coupled to said microstrip ports of said first and second microstrip-to-balanced transitions and to said one of said source and sink of signal, for coupling signal to be transmitted from said source to said radiator when said one of said source and sink is a source, and for coupling received signal from said radiator to said sink when said one of said source and sink is a sink.

9. An antenna element according to claim 7, further comprising:

one of a first source and sink of signal;

a second one of said source and sink of signal;

first coupling means coupled to said microstrip port of said first microstrip-to-balanced transition and to said one of said first source and sink of signal; and second coupling means coupled to said second one of said source and sink of signal;

whereby signals from said first and second sources are coupled to said radiator for radiation if said one of said first source and sink is a source, and whereby signals received by said radiator are coupled to said first and second sinks if said one of said first source and sink is a sink.

10. An antenna according to claim 9, wherein at least one of said first and second sinks of signal includes filter means, for reducing the amount of signal received within a frequency band.

11. An antenna according to claim 7, wherein each of said first and second horn plates defines a bend adjacent said transverse feed plane.

* * * * *